United States Patent
Welty (10) Patent No.: US 6,350,356 B1
(45) Date of Patent: *Feb. 26, 2002

(54) LINEAR MAGNETRON ARC EVAPORATION OR SPUTTERING SOURCE

(75) Inventor: Richard P. Welty, Boulder, CO (US)

(73) Assignee: Vapor Technologies, Inc., Boulder, CO (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/291,343

(22) Filed: Apr. 14, 1999

Related U.S. Application Data (63) Continuation-in-part of application No. 08/979,100, filed on Nov. 26, 1997, now abandoned.

(51) Int. Cl.[7] ............................................... C23C 14/34
(52) U.S. Cl. ........................... 204/298.12; 204/298.11; 204/298.19; 204/298.41
(58) Field of Search ....................... 204/298.12, 298.13, 204/298.41, 298.11, 298.16, 192.38, 298.14, 298.17, 298.02, 298.19, 298.21

(56) References Cited

U.S. PATENT DOCUMENTS

| | | | |
|---|---|---|---|
| 3,783,231 A | 1/1974 | Sablev et al. | 204/298.41 |
| 3,793,179 A | 2/1974 | Sablev et al. | 204/298.41 |
| 4,031,424 A | 6/1977 | Penfold et al. | 204/192.12 |
| 4,116,806 A | 9/1978 | Love et al. | 204/298.19 |
| 4,404,077 A | 9/1983 | Fournier | 204/192.12 |
| 4,448,659 A | 5/1984 | Morrison, Jr. | 204/298.41 |
| 4,486,289 A | 12/1984 | Parsons et al. | 204/298.09 |
| 4,492,845 A | 1/1985 | Kljuchko et al. | 204/192.38 |
| 4,515,675 A | 5/1985 | Kieser et al. | 204/298.12 |
| 4,559,121 A | 12/1985 | Mularie | 204/192.12 |
| 4,581,118 A | 4/1986 | Class et al. | 204/298.16 |
| 4,600,489 A | 7/1986 | Lefkow | 204/192.38 |

(List continued on next page.)

FOREIGN PATENT DOCUMENTS

| | | | | |
|---|---|---|---|---|
| EP | 0 459 137 A | * | 5/1990 | 204/298.41 |

Primary Examiner—Nam Nguyen
Assistant Examiner—Gregg Cantelmo
(74) Attorney, Agent, or Firm—Myron B. Kapustij; Lloyd D. Doigan (57) ABSTRACT

A linear magnetron cathode is disclosed which may be used as a vapor or plasma source for coating deposition or ion processing. The cathode has the shape of an elongated rectangular bar with vaporization of material occurring from an evaporable surface wrapping around the periphery of the bar, along two opposite sides and around both ends. A magnetic field is established over the entire evaporable surface which has a component parallel to the surface and perpendicular to the long direction of the cathode, forming a closed-loop magnetic tunnel around the periphery which directs an arc plasma discharge. Side shields adjacent to and projecting outward from the sides of the evaporable surface block a significant fraction of the macroparticles ejected from reaching the substrate region. The invention provides uniform cathode erosion and a vaporized material stream in two directions over an extended length, permitting uniform deposition or implantation over large areas.

12 Claims, 7 Drawing Sheets

U.S. PATENT DOCUMENTS

| | | | |
|---|---|---|---|
| 4,749,587 A | 6/1988 | Bergmann et al. | 427/570 |
| 4,812,217 A | 3/1989 | George et al. | 204/192.12 |
| 4,849,088 A | 7/1989 | Veltrop et al. | 204/298.41 |
| 4,933,064 A | 6/1990 | Geisler et al. | 204/298.17 |
| 4,994,164 A | 2/1991 | Bernardet | 204/298.41 |
| 5,133,850 A | 7/1992 | Kukla et al. | 204/298.12 |
| 5,262,028 A | 11/1993 | Manley | 204/192.12 |
| 5,266,178 A | 11/1993 | Sichmann | 204/298.19 |
| 5,269,898 A | 12/1993 | Welty | 204/298.41 |
| 5,277,778 A | 1/1994 | Daube et al. | 204/298.19 |
| 5,277,779 A | 1/1994 | Henshaw | 204/298.21 |
| 5,364,518 A | 11/1994 | Hartig et al. | 204/298.22 |
| 5,380,421 A | 1/1995 | Gorokhovsky | 204/298.41 |
| 5,387,326 A | 2/1995 | Buhl et al. | 204/192.38 |
| 5,403,457 A | 4/1995 | Nago et al. | 204/192.2 |
| 5,404,017 A | 4/1995 | Inuishi et al. | 250/492.3 |
| 5,451,308 A | 9/1995 | Sablev et al. | 204/298.41 |
| 5,480,527 A | 1/1996 | Welty | 204/192.38 |
| 5,482,611 A | 1/1996 | Helmer et al. | 204/298.17 |
| 5,512,156 A | 4/1996 | Yamanishi et al. | 204/298.16 |
| 5,518,597 A | 5/1996 | Storer et al. | 204/192.38 |
| 5,531,877 A | 7/1996 | Latz et al. | 204/298.19 |
| 5,587,207 A | 12/1996 | Gorokhovsky | 427/571 |
| 5,589,039 A | 12/1996 | Hsu | 204/192.12 |
| 5,597,459 A | 1/1997 | Atshuler | 204/192.12 |
| 5,804,041 A | 9/1998 | Hurwitt | 204/192.2 |
| 5,997,705 A | * 12/1999 | Welty | 204/298.41 |

* cited by examiner

*Figure - 12*

LINEAR MAGNETRON ARC EVAPORATION OR SPUTTERING SOURCE

RELATED APPLICATION

This application is a continuation-in-part of U.S. application Ser. No. 08/979,100 filed Nov. 26, 1997 entitled "Apparatus for Sputtering or Arc Evaporation" now abandoned.

FIELD OF THE INVENTION

This invention relates to coating deposition and plasma processing (ion implantation, etching, etc.) and particularly to magnetron cathodes.

BACKGROUND OF THE INVENTION

Magnetron cathodes, in which a closed-loop magnetic field is established over at least part of the evaporable surface of the cathode, have come into wide use over the last 2 decades or so in the arts of sputtering and arc evaporation. In the case of a sputtering cathode the magnetic field serves to intensify an inert-gas plasma discharge and guide the plasma in a closed-loop path along the evaporable surface. In the case of an arc cathode, the magnetic field serves to guide the direction of one or more arc spots in a closed-loop path along the evaporable surface. Similar cathode and magnetic field geometries have been used for both sputtering and arc evaporation, with the main differences being the magnetic field strength required and the means of lateral confinement of the discharge. Sputtering cathodes have field strength of typically several hundred Gauss, while arc cathodes typically have field strength of only a few Gauss or tens of Gauss. Most conventional, currently used magnetron cathodes can be described as having basically planar or cylindrical geometry.

Planar magnetrons generally comprise a flat circular or rectangular plate of the material to be vaporized. A magnetic field is projected through or over the plate to form a closed-loop, magnetic tunnel or "racetrack" over the evaporable surface as disclosed for example in U.S. Pat. No. 5,407,551 (Sieck, et al.), U.S. Pat. No. 4,162,954 (Morrison), U.S. Pat. No. 4,673,477 (Ramalingam, et al.), and U.S. Pat. No. 4,724,058 (Morrison). The magnetic tunnel guides and contains the sputtering or arc discharge, typically forming a circular or oval erosion groove on the evaporable surface (the cathode surface from which material is vaporized). Material vaporized by either process is emitted in directions substantially perpendicular to the evaporable surface. Substantially perpendicular directions are understood for the purposes of this invention to refer to an emission distribution centered around the perpendicular to a surface, in which the amount of material emitted from a particular point on the cathode in a particular direction falls off as a function of the angle away from the perpendicular at that point. Substrates to be coated typically face the cathode surface and may be rotated and/or translated to extend the area of uniform coverage. Portions of the cathode surface may be inclined with respect to a planar surface, as disclosed in U.S. Pat. No. 4,428,816 (Class, et al.) and U.S. Pat. No. 4,457,825 (Lamont) in order to influence the distribution of emitted material or the cathode erosion profile.

A rectangular planar triode sputtering apparatus is disclosed in U.S. Pat. No. 4,404,077 (Fournier) in which a parallel field component extends over a non-closed path on the evaporable surface, with an electron emitter at one end of the path and a collector at the other end. A rectangular planar arc cathode is disclosed in U.S. Pat. No. 5,480,527 (Welty) in which the polarity of a parallel field component is reversed to make an arc scan back and forth along the length of the evaporable surface. A rectangular arc evaporation cathode is disclosed in U.S. Pat. No. 5,380,421 (Gorokhovsky) in which the evaporable surface is one side of a rectangular plate having beveled edges, and in which combined static and dynamic magnetic means are taught to control the arc movement along the length. A magnetron sputtering cathode is disclosed in U.S. Pat. No. 5,277,779 (Henshaw) comprising a rectangular frame, in which the erosion path wraps around the inner periphery of the frame, vaporized material is directed inwardly toward the center of the frame aperture, and substrates to be coated are passed through the aperture. A two-sided planar magnetron sputtering cathode is disclosed in U.S. Pat. No. 4,116,806 (Love) which has a separate closed-loop magnetic tunnel on each of two planar targets disposed on each side of a central frame comprising magnetic means. A planar magnetron cathode for either arc evaporation or sputtering is disclosed in U.S. Pat. No. 5,160,595 (Hauzer, et al.), in which part of the magnet means may be moved relative to the target surface in order to adjust the field strength depending on the vaporization method to be employed.

Cylindrical magnetrons generally comprise a cylindrical bar or tube of the material to be vaporized. The evaporable surface is generally the entire exterior or interior cylindrical surface, while the emission distribution depends on the particular magnetic configuration. A cylindrical sputtering cathode with a solenoidal magnetic field parallel to the long cylinder axis is disclosed in U.S. Pat. No. 4,031,424 (Penfold, et al.) which has an emission distribution perpendicular to the exterior surface and (ideally) uniform around the circumference and along the length. Sputtering and arc cathodes using magnetic means inside a cylindrical target to generate a closed-loop magnetic tunnel and erosion track over part of the exterior surface are disclosed for example in U.S. Pat. No. 4,417,968 (McKelvey), U.S. Pat. No. 5,364,518 (Hartig, et al.), and U.S. Pat. No. 4,849,088 (Veltrop, et al.), which employ relative movement between the magnet means and the target cylinder to achieve uniform erosion of the target. The magnetic means may remain fixed while the cylinder rotates or vice versa. The emission distribution is substantially perpendicular to the points on the cylindrical surface comprising the instantaneous location of the erosion track. Short cylindrical arc evaporation cathodes with solenoidal magnetic fields are disclosed in U.S. Pat. No. 4,492,845 (Kljuchko, et al.) and U.S. Pat. No. 5,518,597 (Storer, et al.). Long cylindrical arc evaporation cathodes generally require dynamic means to ensure uniform arc movement over the cathode length, as disclosed for example in U.S. Pat. No. 5,269,898 (Welty) and U.S. Pat. No. 5,451,308 (Sablev, et al). A cylindrical arc cathode in which an external coil applies a magnetic field perpendicular to the long axis of the cathode is disclosed in Soviet Inventor=s Certificate 711787. In this case the arc spots are described to be confined in the area in which the magnetic field lines are near perpendicular to the cathode surface, and it is specified that arc motion around the circumference is achieved by rotating the coil around the cathode. The magnetic field does not in this case comprise a closed-loop tunnel or path over the cathode surface.

Insulator means for preventing arc discharge spots from moving off an evaporable surface are disclosed in U.S. Pat. No 4,430,184 (Mularie). Magnetically permeable ring means for preventing arc spots from moving off an evaporable surface are disclosed in U.S. Pat. No. 4,448,659 (Morrison), U.S. Pat. No. 4,559,121 (Mularie), and U.S. Pat. No. 4,600,489 (Lefkow). Shielding and gap means for extinguishing arc spots which move off specified evaporable surfaces are disclosed in U.S. Pat. No. 3,793,179 and U.S. Pat. No. 3,783,231 (Sablev, et al.). Conductive ring means employing eddy currents for containing an arc discharge are disclosed in U.S. Pat. No. 5,387,326 (Buhl, et al.). Projecting side-wall means for containing a sputtering discharge are taught in U.S. Pat. No. 4,515,675 (Kieser, et al.), U.S. Pat. No. 4,933,064 (Geisler et al.), U.S. Pat. No. 5,133,850 (Kukla, et al.), U.S. Pat. No. 5,266,178 (Sichmann, et al.), and U.S. Pat. No. 5,597,459 (Altshuler) in which outward projections of the target, magnetic poles, or shielding at the sides of the evaporable surface serve to provide lateral confinement of the plasma.

U.S. Pat. No. 4,581,118 (Class, et al.) discloses a magnetron substrate support electrode having a book-shaped rectangular body, and a magnet core with flange-like pole pieces to provide a longitudinal magnetic field wrapped around the electrode body. The apparatus is taught to provide uniform plasma processing of a substrate mounted on the electrode, and is taught for use in conjunction with a separate sputtering cathode facing the support electrode and substrate. The substrate electrode is claimed to be connected to a power supply having voltage appropriate for ionization of the reactant gas adjacent to the substrate surface without causing significant sputtering from the substrate. The apparatus has therefore neither an evaporable surface nor a vapor emission distribution.

It is known to use arc evaporation and sputtering cathodes in ion or plasma sources for implantation or etching processes as disclosed in U.S. Pat. No. 4,994,164 (Bernardet, et al.), U.S. Pat. No. 5,404,017 (Inuishi et al.), U.S. Pat. No. 5,482,611 (Helmer, et al.). It is known to use ions from an arc evaporation cathode to sputter material from a biased secondary cathode for deposition onto a substrate. It is known to use arc evaporation cathodes in conjunction with CVD processes as disclosed in U.S. Pat. No. 4,749,587 (Bergmann) and U.S. Pat. No. 5,587,207 (Gorokhovsky). General descriptions of sputtering and arc evaporation equipment and processes may be found in "Thin Film Processes" by J. Vossen et al. (Academic Press, 1991), "Handbook of Vacuum Arc Science and Technology" by R. Boxman et al (Noyes, 1995), "Glow Discharge Processes" by B. Chapman (Wiley, 1980) and "Thin Film Deposition—Principles and Practice" by D. Smith (McGraw-Hill, 1995).

Sputtering cathodes having the shape of a bar of substantially rectangular cross-section, having erosion surfaces wrapping around a lengthwise periphery of the bar and having substantially bidirectional deposition distributions are disclosed in U.S. Pat. No. 4,194,962 (Chambers et al. 1980), U.S. Pat. No. 4,486,289 (Parsons et al. 1984) and U.S. Pat. No. 4,812,217 (George et al. 1989).

SUMMARY OF THE INVENTION

Figure 1:
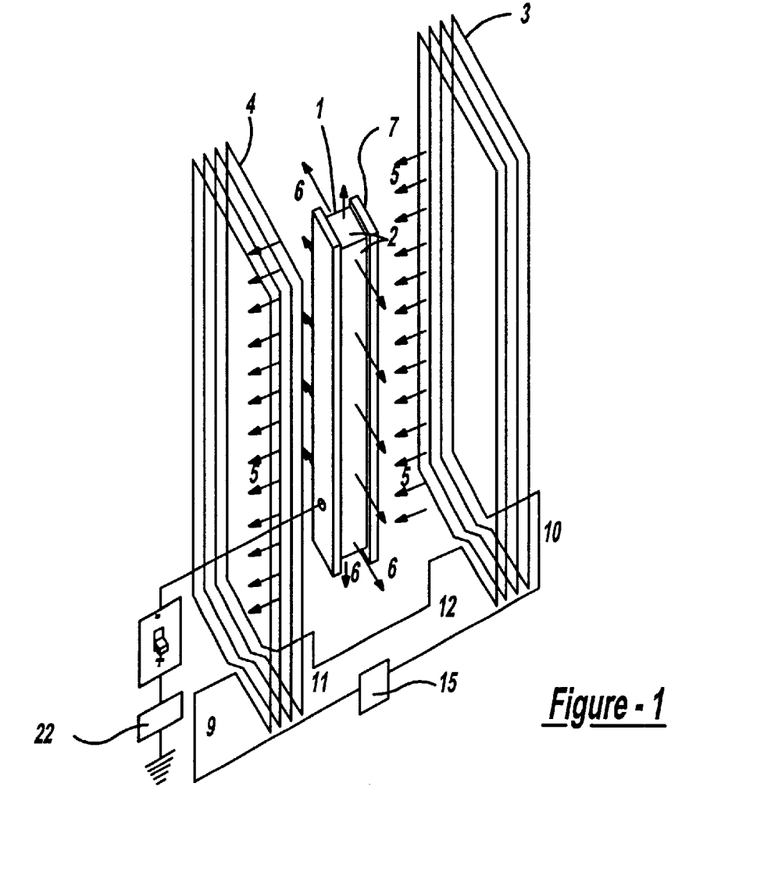
FIG. 1 is a perspective view of the magnetron cathode of the present invention using two electromagnet coils, showing the relative orientations of the evaporable surface, parallel magnetic field component, and vapor emission distribution.

A magnetron cathode is disclosed herein which has a different shape, magnetic field geometry, and emission distribution than conventional and currently available magnetron cathodes. In the present invention, the cathode has the shape of a rectangular bar (parallelepiped) as shown in FIG. 1. Erosion of the cathode material occurs from an evaporable surface wrapping around the periphery of the bar, along two opposite sides and around both ends. The vaporized material emitted from the evaporable surface is therefore distributed mainly in two opposite directions perpendicular to the long axis of the cathode. Vaporized material is also emitted perpendicular to the ends of the cathode, however for sufficiently long cathodes the amount of material emitted in these directions is a small fraction of the total. The invention provides uniform emission over long cathodes, facilitating the coating or implantation of large substrates. Uniform erosion over long arc evaporation cathodes is accomplished without need for complicated switching or dynamic control schemes. Since vapor is emitted in two directions perpendicular to the cathode length rather than only one, the present invention also provides larger area coverage than a conventional rectangular planar magnetron of the same length. Cathode cross-sectional dimensions up to at least 10 cm and lengths up to at least 3 meters are practical according to the present invention, permitting long cathode operating life and large coating area coverage by current industrial standards.

A magnetic field is established around the entire periphery of the cathode using permanent magnets or electromagnets. The field has a component over the entire evaporable surface which is parallel to the surface and perpendicular to the long axis of the cathode. In the cases of both sputtering and arc discharges, the emitted secondary electrons or arc spots (respectively) are caused to move along the evaporable surface in a direction perpendicular to this parallel magnetic field component. Since the parallel magnetic field component is continuous around the periphery of a cathode of the present invention, the electrons or arc spots move around the evaporable surface in a continuous closed-loop path. Cathode material is vaporized from this erosion path by sputtering or arc evaporation, and emitted in directions substantially perpendicular to the surface. A field strength (flux density) for the parallel magnetic field component in the range of 5 to 50 Gauss is generally suitable for arc evaporation cathodes, while a flux density of 200–400 Gauss is generally suitable for sputtering cathodes. Higher field strengths may be desirable in some cases using either technology, for example with materials (such as carbon or copper) having low arc velocities, or when it is desired to sputter at low gas pressures.

The motive force around the closed-loop erosion path, as discussed above, is due to the magnetic field component parallel to the evaporable surface and perpendicular to the cathode length. Lateral forces on the plasma discharge, i.e. in the directions across the width of the erosion path, are also generally necessary to achieve controlled vaporization of (only) the intended evaporable surface. In the case of a sputtering discharge it is desirable to prevent the plasma from diffusing away from the evaporable surface laterally along the magnetic field lines, thus reducing the sputtering rate. In the case of an arc evaporation discharge it is desirable to prevent the arc spots from moving laterally off the intended evaporation surface and onto other cathode or connector surfaces. Various means for lateral control may be employed within the scope of the present invention, depending on whether the cathode is to be used for sputtering or arc evaporation. Lateral control means for arc discharge spots may include for example magnetic means, insulator means, permeable ring means, conductive ring means, shielding means, or projecting side-wall means. Lateral control means for sputtering discharges may include for example magnetic means or projecting side-wall means. Preferred embodiments are described below in which lateral control means are chosen to provide uniform cathode erosion and high material utilization efficiency.

The cathode is typically mounted in a vacuum chamber along with substrates to be coated or implanted, and operated at pressures below 50 mTorr in either arc evaporation or sputtering configurations. Inert and/or reactive gasses such as argon, nitrogen, oxygen, methane, etc. may be introduced into the chamber during operation. During operation the cathode is typically connected to the negative output of a dc power supply, and the positive output of the power supply connected to an anode. The anode may be an electrically isolated structure inside the vacuum chamber, or may be the vacuum chamber itself and/or any interior shielding, etc. In the case of a sputtering cathode, the power supply may have relatively high voltage and low current output capability (e.g. 500 volts and 20 amperes), while for an arc cathode the power supply may have relatively high current and low voltage capability (e.g. 500 amperes and 20 volts). In the case of an arc evaporation cathode the discharge is typically initiated by a mechanical trigger, electrical spark, or laser pulse, while in the case of sputtering simple application of high voltage to the cathode is sufficient to initiate the discharge. Alternatively or in addition to a dc power supply, the cathode may be operated with ac or pulsed power supplies. The substrates to be coated or implanted may be electrically isolated from the cathode, anode, and chamber, and connected to the negative output of another power supply for purposes of increasing the energy of ion bombardment during deposition or implantation. Alternatively the substrates may remain at or near ground potential while the cathode is biased to a positive potential.

Figure 5:
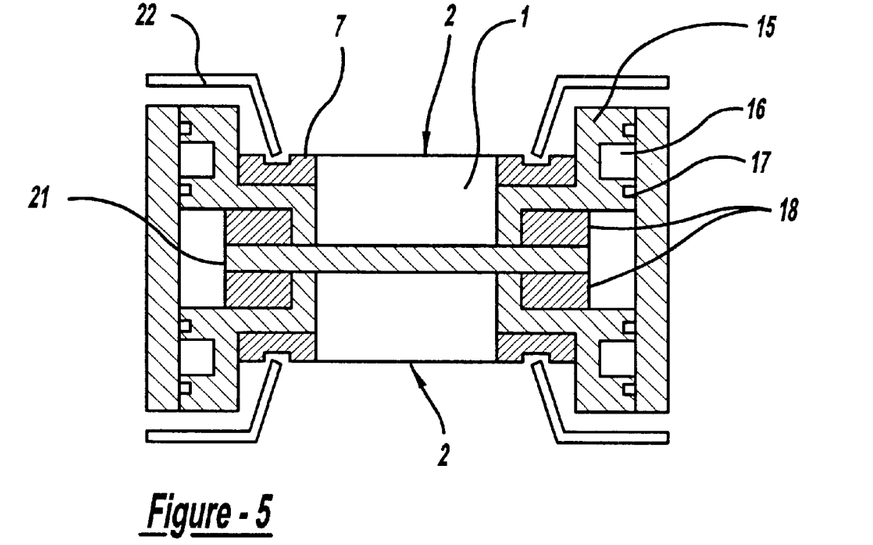
FIG. 5 is a cross-sectional view of another embodiment of the present invention, in which the magnetic field is generated by permanent magnets with direction of magnetization perpendicular to the evaporable surface.

In an arc evaporation discharge there are, in addition to the emitted plasma, also molten droplets of cathode material ejected by the arc. These droplets, referred to as macroparticles, are ejected mainly at low angles to the cathode surface. A further advantage of the present invention as compared to cylindrical and planar arc cathodes of the prior art is that a substantial portion of these macroparticles can be blocked from reaching the substrate by an anode or shielding structure extending outward from the sides of the evaporation surface. For a narrow cathode, relatively short side shielding as shown in FIG. 5 provides substantial macroparticle reduction with minimal blockage of vaporized material. For example in a coating system having substrates arranged in a circle around the cathode as described below, an arc evaporation cathode of the present invention has been found experimentally to reduce the number of macroparticles imbedded in a zirconium nitride coating by at least a factor of 3 compared to a standard commercial cylindrical arc evaporation cathode of similar size.

Figure 9:
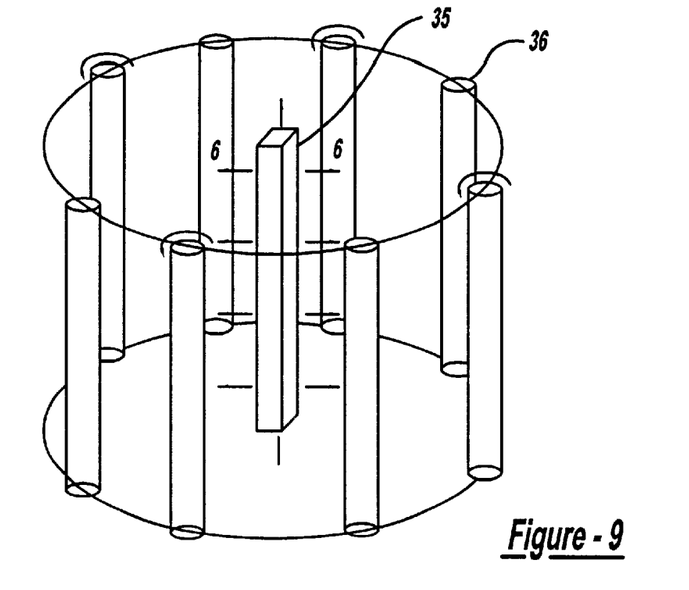
FIG. 9 is an arrangement for coating or ion implantation in which an array of substrates rotates around a central cathode of the present invention.
Figure 10:
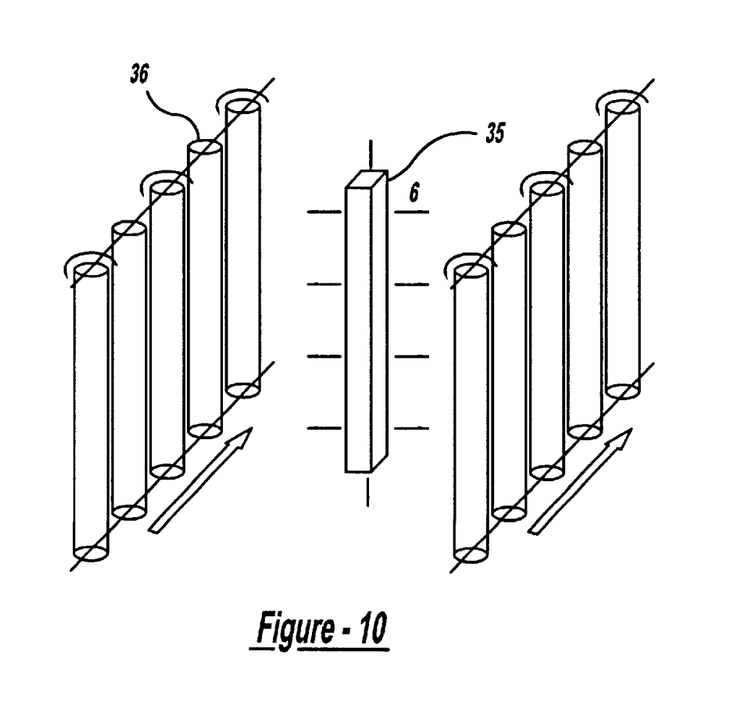
FIG. 10 is an arrangement for coating or ion implantation in which 2 rows of substrates move linearly on both sides past a cathode of the present.

Substrates to be coated or implanted may for example be mounted in a rotating circular array around the cathode and along its length, or on an array of spindles with compound "planetary" rotation as shown in FIG. 9. Emission of material from both sides of the cathode provides more uniform coverage around the substrate array than can be obtained using a single planar magnetron of the prior art. This can be advantageous, for example, in the case of reactive coating deposition, in which it is desirable for reaction conditions to be as uniform as possible around the substrate array in order to obtain uniform properties (such as color). Various other substrate arrangements will be apparent to those skilled in the art. For example in a system with linear substrate motion, the double-sided emission distribution of the present invention permits two parallel rows of substrates to be coated simultaneously, one on each side of the cathode as shown in FIG. 10.

One objective of the present invention is therefore to provide uniform erosion and vapor emission in two opposite directions over extended cathodes, permitting uniform deposition or ion implantation over large areas in a variety of substrate configurations. Further objectives are to permit operation as either a sputtering or arc evaporation cathode by appropriate choice of magnetic field strength and lateral confinement means, to eliminate any need for dynamic arc spot control, to reduce the number of macroparticles emitted by an arc evaporation cathode, and to achieve high cathode material utilization in either arc evaporation or sputtering configuration.

DESCRIPTION OF THE PREFERRED EMBODIMENTS

FIG. 1 shows a simplified view of a magnetron cathode of the present invention, comprising a substantially rectangular bar 1 with evaporable surface 2 wrapping around the periphery (including corresponding opposite surfaces not visible in the perspective view). Electromagnet coils 3 and 4 are disposed coaxially on each side of cathode bar 1, their common axis parallel to all segments of evaporable surface 2 and perpendicular to the long axis of the bar. Small arrows 5 indicate the direction of the magnetic field along the common coil axis due to current in the direction shown in coils 3 and 4. The magnetic field along the axis is parallel to all of evaporable surface 2 and perpendicular to the long axis of cathode bar 1. Large arrows 6 indicate the principle directions of vapor emission, which are substantially perpendicular to evaporable surface 2, at various points around the cathode. For long cathodes most of the vapor is emitted in two opposite directions perpendicular to the long axis of the cathode. Side elements 7 are disposed adjacent to the non-evaporable sides of cathode bar 1, which are the two parallel sides of bar 1 which are not part of evaporable surface 2. Side elements 7 provide lateral confinement of the plasma discharge at the edges of the evaporable surface, and may comprise insulating or metallic plates as described below. Conventional means for mounting, water cooling, shielding, and electrical insulation may be utilized but are not shown. Cathode 1 is connected to the negative output of a plasma discharge power supply 8, which may have appropriate characteristics for either arc or sputtering discharges as described above. The positive terminal of discharge supply 8 is connected to an anode 22, which may be a grounded metal vacuum chamber or a separate structure which may or may not be grounded.

Current in coils 3 and 4 may be provided by a coil power supply 15 connected to coil terminals 9 and 10, with coil terminals 11 and 12 connected together. Alternatively (connections not shown) the coil current may be provided by connecting coil terminal 9 to ground (or to an anode), and terminal 10 to the positive output of discharge supply 8 (or vice versa), such that the discharge current from discharge supply 8 also flows through coils 3 and 4. The coils 3 and 4 may be shielded from the discharge plasma within or outside the vacuum chamber, or may be exposed to the plasma within the vacuum chamber and thus form part of the anode of the discharge. In another embodiment (connections not shown), coils 3 and 4 are located within the vacuum chamber, exposed to the plasma, and function as the only anode for the discharge. In this embodiment, coil terminals 10 and 11 are connected together, as are coil terminals 9 and 12 which are also connected to the positive output of discharge supply 8. Electron current collected by the anode therefore flows through both coils 3 and 4 to the positive terminal of discharge supply 8, generating a magnetic field as indicated by small arrows 5. In this configuration it may be desirable to ground coils 3 and 4 temporarily to facilitate initiation of the plasma discharge.

Figure 2:
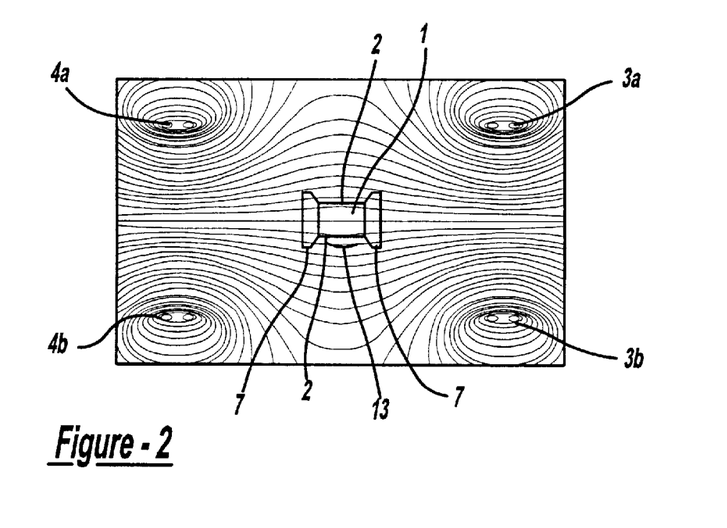
FIG. 2 is a cross-sectional top view of the magnetic field lines produced by the electromagnet coils.

FIG. 2 shows a plot of the magnetic flux lines in a cross-section (top view) of the cathode and coil arrangement of FIG. 1. The direction of current flow is into the page in wires 3a and 4a and out of the page in wires 3b and 4b. A cathode may generally be operated with coil current flowing in either direction. Small arrows 5 show the direction of the flux lines at the indicated locations, corresponding to small arrows 5 in FIG. 1. The flux lines in the regions 13 above evaporable surface 2 are substantially parallel to surface 2, but are slightly convexly arched due to the additional presence of magnetic field components perpendicular to surface 2 as described below. The degree of arching, and therefore the degree of magnetic lateral confinement of the plasma discharge, can be controlled by size and location of the coils, with larger more distant coils causing less arching and smaller less distant coils causing more arching. The coil current and number of coil turns may be chosen to provide the desired field strength, according to the means of providing the coil current. For example a current of 250 amps in 4-turn coils 3 and 4 of FIG. 2 will provide a parallel field component of about 40 Gauss at the cathode surface, while a current of 20 amps in coils 3 and 4 having 500 turns each would provide a parallel field component of about 400 Gauss.

Side elements 7 may project a distance d of zero or greater above (outward from) the surface, and may have side walls 14 facing evaporable surface 2 which are inclined at an angle $\alpha$ of zero or greater away from the perpendicular to the surface. Various embodiments of side elements 7 may be employed within the scope of the present invention. In one preferred embodiment of an arc evaporation cathode, insulating plates (for example boron nitride) are placed in contact with both edges of evaporable surface 2 to prevent movement of an arc spot off evaporable surface 2. The insulating plates may be flush with the evaporable surface (i.e. d=0) or may extend a distance of several millimeters or more outward from the evaporable surface. In another preferred embodiment of an arc cathode, side elements 7 comprise metallic plates in contact with both edges of evaporable surface 2. The plates may comprise for example the cathode material itself, another metal such as stainless steel, a magnetically permeable material or preferably a material with higher arc discharge voltage than the evaporable surface, and may preferably project a distance d of several millimeters or more above the evaporable surface around its entire periphery. Materials having high arc discharge voltages include refractory metals such as molybdenum and tantalum. The projecting element 7 may also preferably have a wall angle $\alpha$ of 20 degrees or more, thus forming acute angles between the magnetic field lines and the projecting side walls of elements 7. An arc spot which moves onto the angled side wall will therefore tend to be pushed back down onto the evaporable surface by interaction with the magnetic field. In another embodiment of an arc cathode, electrically grounded or isolated metallic plates are disposed adjacent to both edges at a distance of around 1 mm or greater, in order to extinguish arcs moving off evaporable surface 2 or to repel the arc spot by means of eddy currents. One preferred embodiment of a sputtering cathode employs metallic side elements 7 which project a distance d of several millimeters or more above the evaporable surface, having walls which may be inclined at an angle $\alpha$ from zero to around 70 degrees. The side elements may be composed of the cathode material or another electrically conductive material. The projecting side walls serve in this case to prevent diffusion of the sputtering plasma along the magnetic field lines away from evaporable surface 2. In another preferred embodiment of a sputtering cathode, side elements 7 may comprise metallic plates disposed adjacent to both edges at a distance of around 1 mm or greater and projecting a distance d of several millimeters or more above the evaporable surface. The plates may be electrically floating or biased at a voltage intermediate between cathode and anode, and may comprise part of the cathode housing or magnetic pole structures. The projecting side walls serve also in this case to prevent diffusion of the sputtering plasma along the magnetic field lines away from evaporable surface 2.

In addition to or instead of lateral confinement means employing side elements 7, lateral confinement of a sputtering or arc discharge may be accomplished by means of a closed-loop, convexly-arched magnetic tunnel wrapping around the periphery of the rectangular bar above the evaporable surface. The arched shape of the magnetic tunnel can be described as due to the addition of perpendicular magnetic field components to the previously described parallel component, producing a net convex curvature of the field in the region above the evaporable surface. The perpendicular field components produce lateral forces on the sputtering plasma or arc spot, pushing it toward the center of the erosion track from both sides. Stronger perpendicular components result in more field curvature and stronger lateral confinement forces. Formation of a narrow erosion groove in the cathode may be prevented by utilizing a magnetic field which changes curvature from convex above the cathode surface to concave below the surface (within the cathode material) as described in U.S. Pat. No. 4,892,633 (Welty) and shown in FIGS. 7 and 8 of the present invention. The perpendicular magnetic field components may be generated by appropriate configuration and placement of the same magnetic field generating means which produce the magnetic field component parallel to the evaporable surface. Commercial finite-element magnetic modeling programs such as Maxwell from Ansoft Corporation of Pittsburgh, PA provide suitable capability for cathode design purposes.

Figure 3:
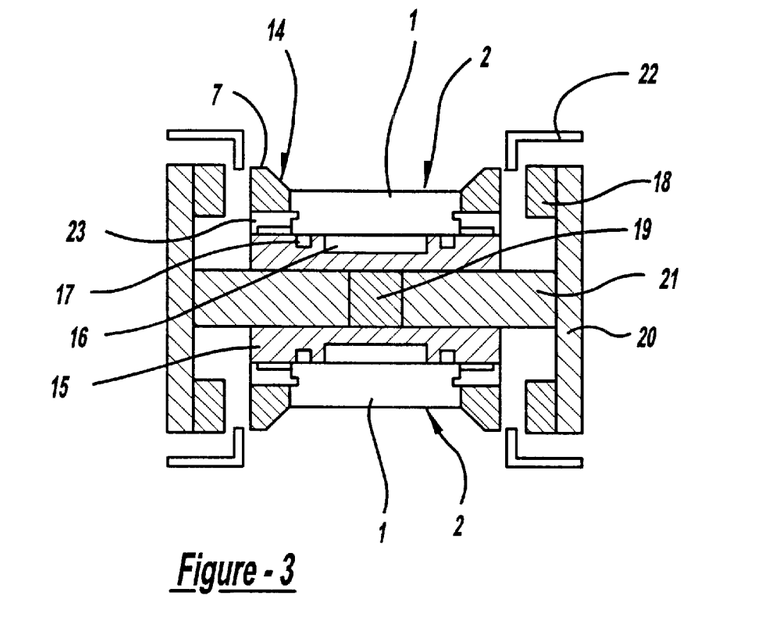
FIG. 3 is a cross-sectional view of one embodiment of the present invention, in which the magnetic field is generated by permanent magnets with direction of magnetization parallel to the evaporable surface.

FIG. 3 shows a cross-sectional view of a preferred embodiment of the present invention, in which replaceable cathode elements 1 having evaporable surfaces 2 are mounted around the periphery of mounting block 15, comprising a rectangular bar with water cooling channels 16 and o-ring seals 17. Side elements 7 having side walls 14 are disposed around both edges of evaporable surface 2, and project a distance of at least around 2 mm and more preferably around 5 to 10 mm above the evaporable surface around its entire periphery. Elements 7 may also preferably have a wall angle α in FIG. 1-B) of 20 degrees or more away from the perpendicular. In the case of an arc cathode, side elements 7 may comprise for example the cathode material itself, another metal, an insulating material, a magnetically permeable material, or preferably a metal having an arc discharge voltage higher than that of the evaporable surface material. In the case of a sputtering cathode, side elements 7 may be comprise the same material as the cathode or another electrically conductive material. Cathode elements 1 are held on mounting block 15 by clamps 23 using screws not shown. Magnetic field generating means comprise side magnets 18 and center magnet 19, side magnetically permeable pole pieces 20 and center permeable pole pieces 21. Magnets 18 and 19 have magnetization oriented parallel to evaporable surfaces 2 in the directions indicated by the arrows within the magnet blocks. An anode 22 is disposed adjacent to the edges of evaporable surface 2. Conventional mounting, connection, shielding, and insulator means may be used but are not shown.

Figure 4:
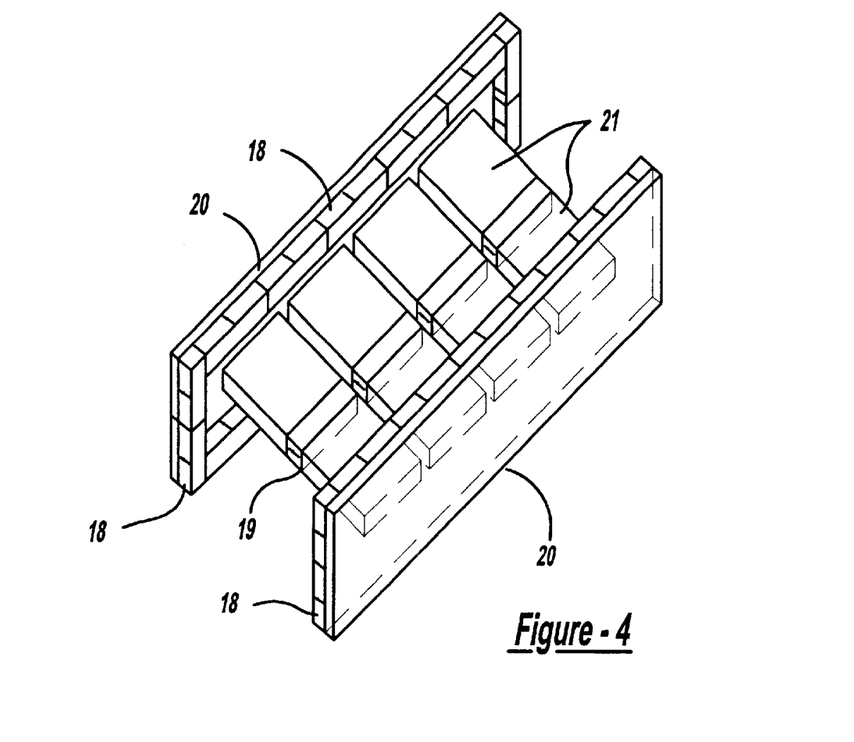
FIG. 4 is a perspective view of the magnetic field generating means of the embodiment of FIG. 3.
Figure 7:
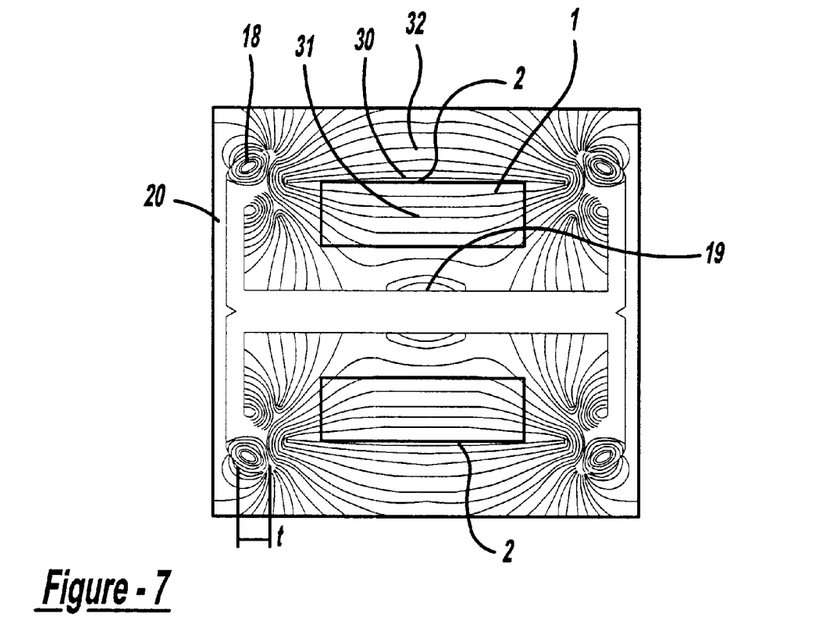
FIG. 7 is a plot representing the magnetic field lines produced by the magnet and pole configuration of FIG. 3.

FIG. 4 shows a perspective view of the magnets and pole pieces of the embodiment of FIG. 3. Side magnets 18 are mounted around the edges of side permeable pole pieces 20. Center magnets 19 are mounted between segments of center permeable pole pieces 21, which are disposed between side pole pieces 20. Magnets 18 and 19 and pole pieces 20 and 21 together form a magnetic circuit having a pole gap between the magnets 18 on opposite sides of evaporable surface 2 shown in FIG. 3. Magnetic flux is generated across the gap between opposing faces of magnets 18 as shown in FIG. 7. Cathode elements 1 are located within the pole gap such that flux generated in the pole gap passes over all of evaporable surfaces 2, including the ends, providing a magnetic field component parallel to evaporable surfaces 2 around the entire periphery of the cathode. Center pole pieces 21 pass through the center of the mounting block 15 (FIG. 3) and magnetically connect the two side pole pieces 20, in order to complete the magnetic circuit and provide a "return path" for magnetic flux. Magnets 18 provide most of the magnetic field within the pole gap, while magnets 19 serve mainly to influence the shape of the field within the gap. Center pole pieces 21 may be fabricated in multiple separate sections along the length of the cathode, as shown in FIG. 4, in order to preserve the mechanical integrity of mounting block 15.

Figure 6:
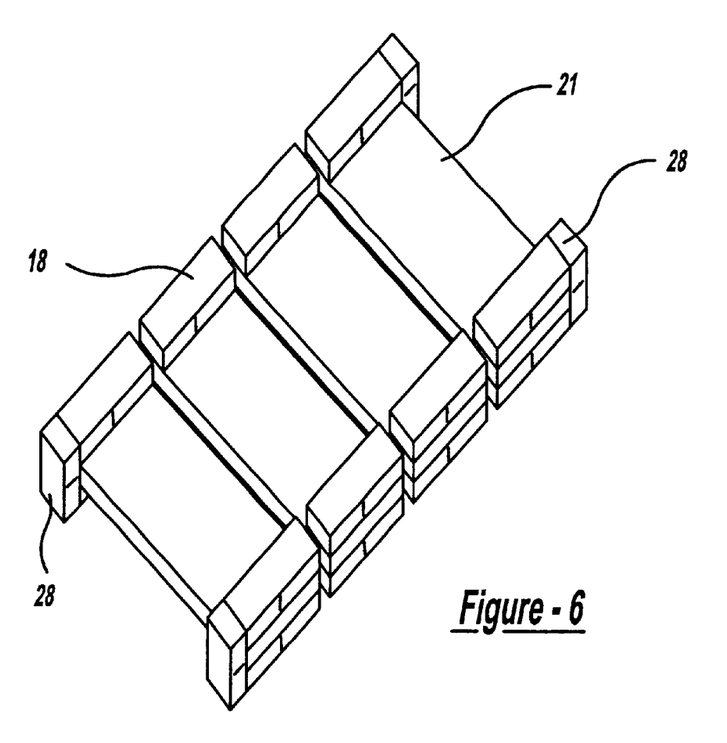
FIG. 6 is a perspective sketch of the magnetic field generating means of the embodiment of FIG. 5.

FIG. 5 shows a cross-sectional view of another preferred embodiment of the present invention, in which the cathode comprises a rectangular bar 1 having evaporable surface 2. Mounting blocks 15 having water channels 16 and o-ring seals 17 are disposed on the non-evaporable sides of bar 1 and are clamped in tight contact by conventional means not shown to provide cathode cooling. Side elements 7 are disposed around the edges of evaporable surface 2, and may comprise insulating or metallic materials as discussed for FIGS. 2 and 3. Magnetic field generating means comprise side magnets 18 and center magnetically permeable pole pieces 21. Magnets 18 have magnetization oriented perpendicular to evaporable surfaces 2 as indicated by the arrows. Center pole pieces 21 may be fabricated in multiple separate sections along the length of the cathode, as shown in FIG. 6, in order to preserve the mechanical integrity of cathode bar 1. An anode 22 is disposed along the edges and extending outward from evaporable surface 2. Conventional mounting, connection, shielding, and insulator means may be used but are not shown.

Figure 8:
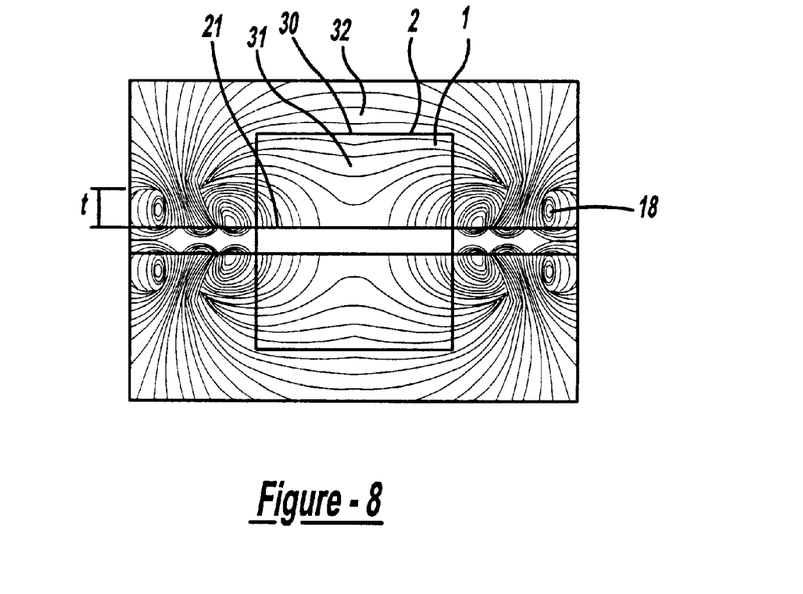
FIG. 8 is a plot representing the magnetic field lines produced by the magnet and pole configuration of FIG. 5.

FIG. 6 shows a perspective view of the magnets and pole pieces of the embodiment of FIG. 5. Magnets 18 are mounted around the periphery of the center pole piece 21 on opposite sides of the cathode bar 1. Magnets 28, having magnetization perpendicular to the evaporable surface on the end of the cathode bar, are disposed on the pole pieces 21 at the ends of the cathode, in order to generate a parallel field component over the evaporable surface at the ends. Magnets 18 and pole pieces 21 together form a magnetic circuit having a pole gap between magnets 18 on opposite sides of evaporable surface 2. Magnetic flux is generated across the gap between opposing faces of magnets 18 as shown in FIG. 8. Cathode bar 1 is located within the pole gap such that flux generated in the pole gap passes over all of evaporable surface 2, including the ends, providing a magnetic field component parallel to evaporable surfaces 2 around the entire periphery of the cathode. Center pole pieces 21 pass through the center of cathode bar 1 and magnetically connect the magnets 18 on opposite sides of the cathode, in order to complete the magnetic circuit and provide a "return path" for magnetic flux.

FIGS. 7 and 8 show plots representing cross-sections of the magnetic field generated by the magnet and pole structure of FIGS. 3 and 5, respectively. Referring now to both FIGS. 7 and 8, the magnetic flux lines in the region 30 near evaporable surface 2 are predominantly parallel to evaporable surface 2 and perpendicular to the long axis of the cathode. The magnetic field is convexly arched in the region 31 above the evaporable surface and concavely arched in the region 32 below the evaporable surface within the cathode bulk, in order to provide magnetic lateral confinement of the plasma discharge above the evaporable surface while preventing formation of a narrow erosion groove as the cathode material is vaporized. The strength of the magnetic field may be controlled by selection of the magnet material and of the thickness "t" of the magnet (in the direction of magnetization). For example in the configurations of both FIGS. 7 and 8, ceramic grade-8 magnets 3 mm thick will provide a parallel field component of around 50 Gauss across an evaporable surface width of 7.5 cm, while neodymium grade-35 magnets 10 mm thick will provide a parallel field component of around 500 Gauss. Magnets of these types can be obtained, for example, from Magnet Sales, Inc. of Los Angeles, Calif.

FIG. 9 shows an arrangement for coating deposition or ion implantation in which a multiplicity of substrate mounting spindles 36 are disposed around a central cathode 35 of the present invention. Mounting spindles 36 may comprise means for holding a number of smaller substrates to be coated or implanted. Arrows 6 indicate the directions of vapor emission from cathode 35. The entire array of substrates may rotate around the cathode 35 to achieve uniform coverage. Individual substrates 36 may also rotate around their own axes to improve uniformity or increase the substrate mounting area. Various other arrangements are possible within the scope of the present invention. For example, FIG. 10 shows an arrangement for coating deposition or ion implantation in which two streams of substrates 36 move linearly past a central cathode 35 of the present invention. The substrates may move continuously or intermittently, and may also rotate on their own axes to improve uniformity or increase the substrate mounting area. In another embodiment, a cathode and anode assembly such as that shown in FIG. 3 may be used to coat the inside of a pipe or tube, with relative rotation between the cathode and pipe to obtain uniform coverage. Lower macroparticle content can thereby be obtained in arc-deposited internal pipe coatings than can be obtained using a cylindrical arc cathode.

Figure 11:
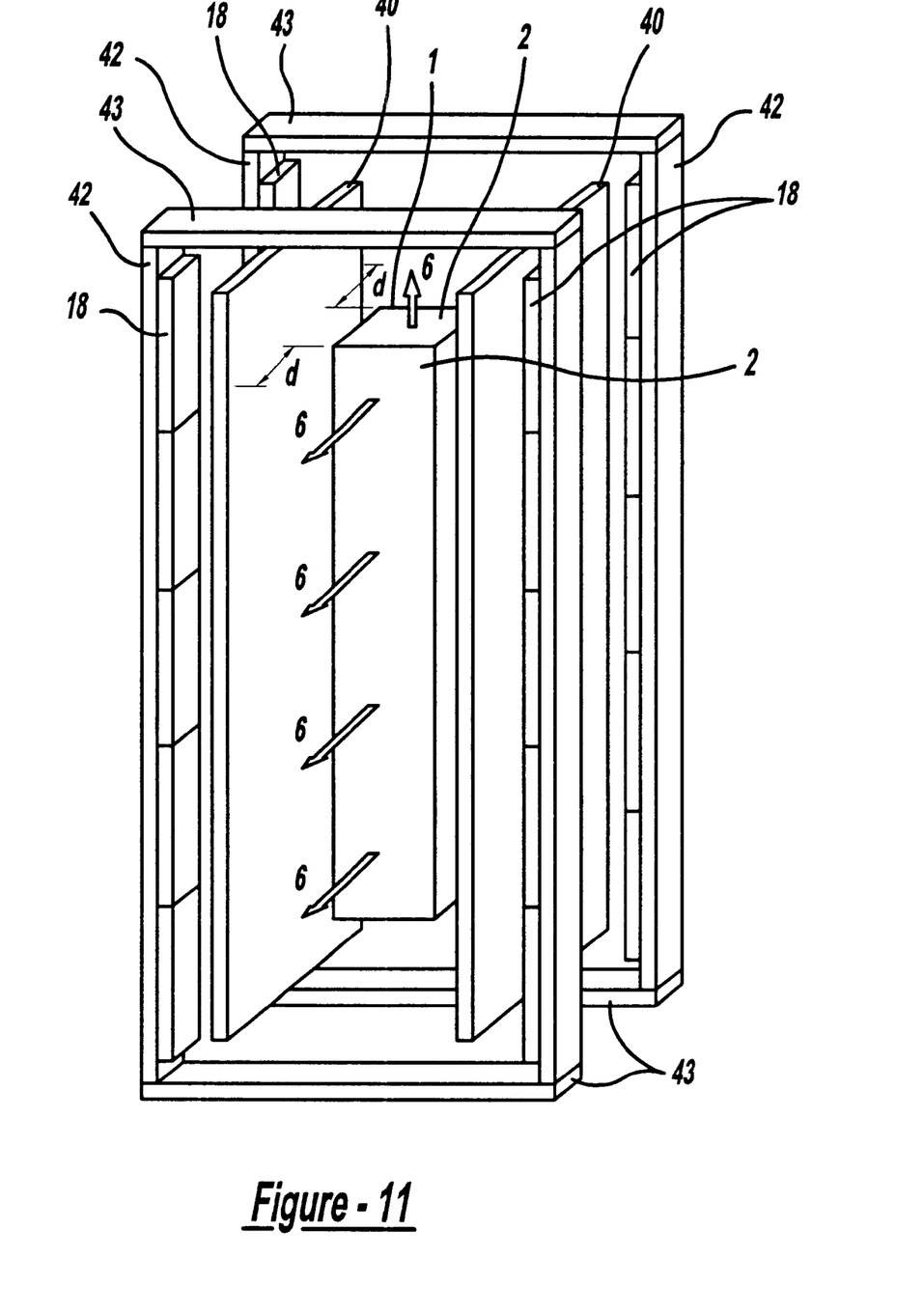
FIG. 11 is a perspective view of an arc evaporation cathode of the present invention, showing side shields for blocking macroparticles and permanent magnet means.

FIG. 11 shows a simplified perspective view of an arc evaporation cathode of the present invention, in which two side shields 40 are disposed adjacent to the sides of rectangular bar cathode 1. The side shields project outward from the evaporable surface 2 by a distance "d" along both long sides of the cathode. The side shields 40 function to block macroparticles ejected at (selectable) low angles from the evaporable surface from reaching the substrate region. The side shields 40 may also preferably be connected as the anode of the arc discharge, and may preferably be water cooled.

Figure 12:
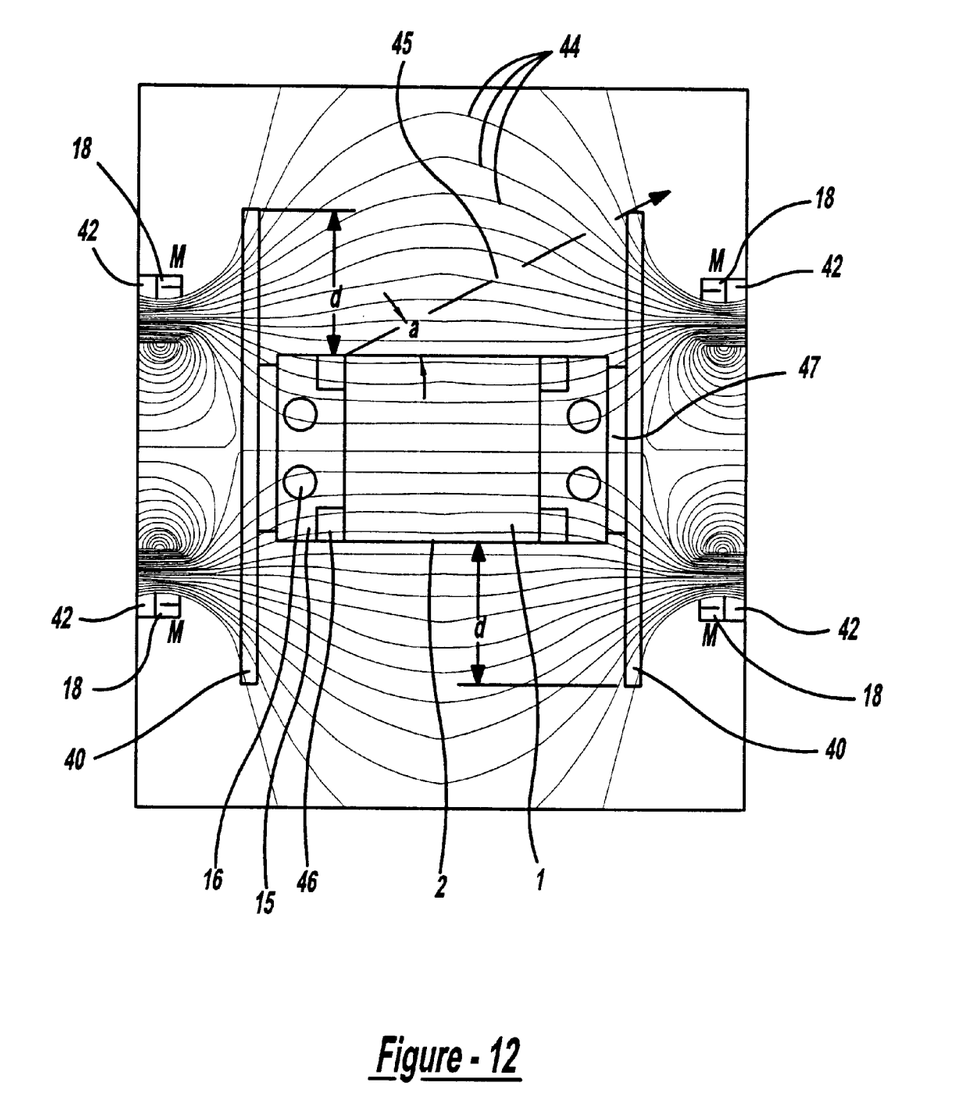
FIG. 12 is a cross-sectional plot representing the magnetic field lines produced by the magnet and pole configuration of FIG. 11.

Magnetic field generating means comprise two magnetic assemblies each comprising permanent magnets 18 and a rectangular frame comprising two long sides 42 and two ends 43. The frame members are made of magnetically permeable material such as steel. Magnets 18 are mounted on the inside faces of long sides 42, with the direction of magnetization the same for all magnets. The frame serves to provide a return path for magnetic flux and intensify the field in the gap between magnet forces within the frame and in the cathode region. The frames are mounted parallel to each other and adjacent to the side shields. The width of the frames and the separation between them may be chosen such that the magnetic field lines in the region of the cathode are parallel to evaporable surface 2 as shown in FIG. 12. The length of the frame assembly is preferably longer than that of the cathode in order to provide good magnetic field uniformity around the ends of the cathode.

FIG. 12 shows a cross-sectional scaled drawing of an embodiment corresponding to FIG. 11. Cooling blocks 15 with water channels 16 are clamped tightly to cathode 1 by means not shown. Insulators 46 disposed along the edges of evaporable surface 2 prevent the arc spots from moving laterally off the evaporable surface. Mounting insulators 47 are disposed between cooling blocks 15 and side shields 40. Magnets 18 are mounted on the inside faces of pole pieces 42. The direction of magnetization "M" is the same in all of the magnets. Magnetic flux lines 44 are flat and parallel to the evaporable surface throughout the cathode volume. (The computer model is 2-dimensional, so modifications were made to the shape pole pieces 42 outside the limits of the plot in order to make the flux lines 44 represent the 3-d case accurately.) For a cathode width of 7.5 cm, it has been determined through modeling and verified experimentally that barium ferrite ceramic grade 5 magnets having cross-sectional dimensions of approximately 1 cm×2.5 cm generate a magnetic field of approximately 40 Gauss at the evaporable surface. The distance "d" by which the side shields 40 project outward from the evaporable surface 2 may be chosen such that a macroparticle 45 ejected from any point on the evaporable surface will be blocked if the angle at which it is ejected is smaller than a specified ejection cutoff angle "α". The cutoff angle may range from about 10 degrees to at least 60 degrees, with larger cutoff angles blocking more of the macroparticles but also intercepting more of the vapor stream and hence reducing the source output. A preferred value for the cutoff angle is around 25 degrees, as is the case for FIG. 12.

The magnetic means of FIGS. 11 and 12 differ significantly from that of the prior art in that the flux return path for opposing magnets (across the target face) is not through the center of the target, but rather around the ends through end frame members 43. The frame-shaped pole piece construction of the present invention has the advantages that no penetration through the cathode is required for the pole pieces or magnets, and that the magnetic assemblies may be made sufficiently long that the field is uniform around the ends of the target without need for additional magnetic or field shaping means. In another embodiment (not shown) similar to that shown in FIGS. 11 and 12, the pole piece may comprise a single wider frame spanning the combined width of the two frames of FIGS. 11 and 12.

Multiple cathodes of the same or different evaporable materials may be placed inside the substrate array in order to increase the total vaporization rate or to deposit or implant mixed alloys or multi-layered structures. The cathode of the present invention is well suited to side-by-side arrangements since the evaporable surface can be made much narrower than is possible for a planar magnetron cathode, thereby providing a more compact cathode assembly and more overlap of the emission distributions. It may be advantageous to use both sputtering and arc cathodes in a multiple cathode system. For example a sputtered coating can be deposited first, then an arc evaporated coating, or vice-versa. In the case of alloying certain materials it may be desirable to operate one cathode (e.g. aluminum) as a sputtering cathode to avoid excessive macroparticle generation, while operating the other (e.g. titanium) as an arc evaporation cathode to obtain the benefits of enhanced ionization and reactivity. Side-by-side mounting of multiple cathodes may require adjustment of the magnetic pole strengths or orientation to compensate for magnetic interaction between cathodes.

In the case of arc evaporation, the manner of attaching the power cables to the cathode can have an effect on the cathode erosion uniformity. Arc currents of several hundred amperes within the cables and the cathode itself generate magnetic fields which can affect the movement of the arc spots on the evaporable surface. For arc evaporation cathodes of the present invention it is generally desirable to make power connections symmetrically on both non-evaporable sides of the cathode. The power cables may be routed symmetrically along the sides of the cathode in order to obtain maximum cancellation of the self-magnetic fields.

The entire disclosures of all patents, patent documents, and publications cited herein are incorporated by reference as if each were individually incorporated. While particular embodiments of the present invention have been shown and described, various modifications thereof will be apparent to those skilled in the art. Therefore, it is not intended that the invention be limited to the disclosed embodiments. The term "substantially rectangular" in referring to the shape of a cross section of a cathode of the present invention is understood to include variations in overall shape due to mounting means, insulators, etc. and variations in the profile of the evaporable surface which may be desirable to improve lateral confinement of the plasma discharge or influence the erosion or emission distribution.

What is claimed is:

1. An apparatus for arc evaporation comprising a cathode having the shape of a bar of substantially rectangular cross section, the length of said bar being greater than either dimension of said rectangular cross-section, the outer surface of said cathode having four sides and two ends, said four sides comprising a first pair of parallel sides and a second pair of parallel sides, said cathode comprising an evaporable surface comprising at least one material to be vaporized, said evaporable surface defined by both members of said first parallel pair of sides and both said ends of said cathode, said cathode functioning to emit vapors and macroparticles of said material to be vaporized, said vapors being emitted in the directions substantially perpendicular to said evaporable surface;

two side shields disposed adjacent to the sides of said cathode, said side shields projecting outward from said evaporable surface along said long sides by a selectable distance, said side shields functioning to block at least a portion of the macroparticles ejected from said evaporable surface, said selectable distance defining a cutoff ejection angle below which macroparticles ejected from any point on said evaporable surface will be blocked, said cutoff ejection angle being at least about 15 degrees;

magnetic field generating means for establishing in a vicinity of said evaporable surface of said cathode a magnetic field, wherein said magnetic means comprise two magnetic assemblies, each assembly comprising at least two permanent magnets and one rectangular frame, each of said frames comprising magnetically permeable members comprising two long sides including inside faces and two ends, said permanent magnets being mounted on the inside faces of said long sides of said frames, said frames being mounted parallel to each other and adjacent to said side shields, said magnetic field being represented by magnetic flux lines, said magnetic field having a component over all of said evaporable surface which is parallel to said evaporable surface and perpendicular to said second pair of parallel sides of said cathode, said magnetic field functioning to direct at least one arc discharge spot on said evaporable surface in a closed loop path around the periphery of said cathode, such that said material to be vaporized is vaporized from said evaporable surface.

2. An apparatus of claim 4 in which said cutoff ejection angle is at least about 25 degrees.

3. An apparatus of claim 4 in which said portion of macroparticles blocked is at least about 50% of the total number of macroparticles ejected.

4. An apparatus for arc evaporation comprising a cathode having the shape of a bar of substantially rectangular cross section, the length of said bar being greater than either dimension of said rectangular cross-section, the outer surface of said cathode having four sides and two ends, said four sides comprising a first pair of parallel sides and a second pair of parallel sides, said cathode comprising an evaporable surface comprising at least one material to be vaporized, said evaporable surface defined by both members of said first parallel pair of sides and both said ends of said cathode, said cathode functioning to emit vapors and macroparticles of said material to be vaporized, said vapors being emitted in the directions substantially perpendicular to said evaporable surface;

two side shields disposed adjacent to the sides of said cathode, said side shields projecting outward from said evaporable surface along said long sides by a selectable distance, said side shields functioning to block at least a portion of the macroparticles ejected from said evaporable surface, said selectable distance defining a cutoff ejection angle below which macroparticles ejected from any point on said evaporable surface will be blocked, said cutoff ejection angle being at least about 15 degrees;

magnetic field generating means for establishing in a vicinity of said evaporable surface of said cathode a magnetic field, wherein said magnetic means comprise at least two permanent magnets and one rectangular frame, said frame comprising magnetically permeable members comprising two long sides including inside faces and two ends, said permanent magnets being mounted on the inside faces of said long sides of said frame, said magnetic field being represented by magnetic flux lines, said magnetic field having a component over all of said evaporable surface which is parallel to said evaporable surface and perpendicular to said second pair of parallel sides of said cathode, said magnetic field functioning to direct at least one arc discharge spot on said evaporable surface in a closed loop path around the periphery of said cathode, such that said material to be vaporized is vaporized from said evaporable surface.

5. An apparatus of claim 4 in which said cutoff ejection angle is at least about 25 degrees.

6. An apparatus of claim 4 in which said portion of macroparticles blocked is at least about 50% of the total number of macroparticles ejected.

7. An apparatus for arc evaporation comprising a cathode having the shape of a bar of substantially rectangular cross section, the length of said bar being greater than either dimension of said rectangular cross-section, the outer surface of said cathode having four sides and two ends, said four sides comprising a first pair of parallel sides and a second pair of parallel sides, said cathode comprising an evaporable surface comprising at least one material to be vaporized, said evaporable surface defined by both members of said first parallel pair of sides and both said ends of said cathode, said cathode functioning to emit vapors and macroparticles of said material to be vaporized, said vapors being emitted in the directions substantially perpendicular to said evaporable surface;

two side shields disposed adjacent to the sides of said cathode, said side shields projecting outward from said evaporable surface along said long sides by a selectable distance, said side shields functioning to block at least a portion of the macroparticles ejected from said evaporable surface, said selectable distance defining a cutoff ejection angle below which macroparticles ejected from any point on said evaporable surface will be blocked, said cutoff ejection angle being at least about 15 degrees;

magnetic field generating means for establishing in a vicinity of said evaporable surface of said cathode a magnetic field, wherein the magnetic field generating means comprise at least two electromagnet coils, each having a central axis, said coils being disposed coaxially on two sides of said cathode such that said central axes are perpendicular to said second pair of parallel sides of said cathode, said coils functioning to generate a magnetic field having a component parallel to said evaporable surface over all of said evaporable surface, which is parallel to said evaporable surface and perpendicular to said second pair of parallel sides of said cathode, said magnetic field functioning to direct at least one arc discharge spot on said evaporable surface in a closed loop path around the periphery of said cathode, such that said material to be vaporized is vaporized from said evaporable surface.

8. An apparatus of claim 7 in which said cutoff ejection angle is at least about 25 degrees.

9. An apparatus of claim 7 in которого said portion of macroparticles blocked is at least about 50% of the total number of macroparticles ejected.

10. An apparatus for arc evaporation or sputtering comprising a cathode having the shape of a bar of substantially rectangular cross section, the length of said bar being greater than either dimension of said rectangular cross-section, the outer surface of said cathode having four sides and two ends, said four sides comprising a first pair of parallel sides and a second pair of parallel sides, said cathode comprising an evaporable surface comprising at least one material to be vaporized, said evaporable surface defined by both members of said first parallel pair of sides and both said ends of said cathode, said cathode functioning to emit vapors of said material to be vaporized, said vapors being emitted in the directions substantially perpendicular to said evaporable surface;

magnetic field generating means for establishing in a vicinity of said evaporable surface of said cathode a magnetic field, said magnetic field generating means comprising two magnetic assemblies, each assembly comprising at least two permanent magnets and one rectangular frame, each of said frames comprising magnetically permeable members comprising two long sides and two ends, said permanent magnets being mounted on the inside faces of said long sides of said frames, said frames being mounted parallel to each other and adjacent to side shields, said magnetic field being represented by magnetic flux lines, said magnetic field having a component over all of said evaporable surface which is parallel to said evaporable surface and perpendicular to said second pair of parallel sides of said cathode, said magnetic field functioning to direct at least one arc discharge spot in arc evaporation or emitted secondary electrons in sputtering on said evaporable surface in a closed loop path around the periphery of said cathode, such that said material to be vaporized is vaporized from said evaporable surface.

11. An apparatus for arc evaporation or sputtering comprising a cathode having the shape of a bar of substantially rectangular cross section, the length of said bar being greater than either dimension of said rectangular cross-section, the outer surface of said cathode having four sides and two ends, said four sides comprising a first pair of parallel sides and a second pair of parallel sides, said cathode comprising an evaporable surface comprising at least one material to be vaporized, said evaporable surface defined by both members of said first parallel pair of sides and both said ends of said cathode, said cathode functioning to emit vapors of said material to be vaporized, said vapors being emitted in the directions substantially perpendicular to said evaporable surface;

magnetic field generating means for establishing in a vicinity of said evaporable surface of said cathode a magnetic field, said magnetic field generating means comprising at least two permanent magnets and one rectangular frame, said frame comprising magnetically permeable members comprising two long sides and two ends, said permanent magnets being mounted on the inside faces of said long sides of said frame, said magnetic field being represented by magnetic flux lines, said magnetic field having a component over all of said evaporable surface which is parallel to said evaporable surface and perpendicular to said second pair of parallel sides of said cathode, said magnetic field functioning to direct at least one arc discharge spot in arc evaporation or emitted secondary electrons in sputtering on said evaporable surface in a closed loop path around the periphery of said cathode, such that said material to be vaporized is vaporized from said evaporable surface.

12. An apparatus for arc evaporation or sputtering comprising a cathode having the shape of a bar of substantially rectangular cross section, the length of said bar being greater than either dimension of said rectangular cross-section, the outer surface of said cathode having four sides and two ends, said four sides comprising a first pair of parallel sides and a second pair of parallel sides, said cathode comprising an evaporable surface defined by both members of said first parallel pair of sides and both said ends of said cathode, said cathode functioning to emit vapors of said material to be vaporized, said vapors being emitted in the directions substantially perpendicular to said evaporable surface;

magnetic field generating means for establishing in a vicinity of said evaporable surface of said cathode a magnetic field, said magnetic field generating means comprising at least two electromagnet coils, each having a central axis, said coils being disposed coaxially on two sides of said cathode such that said central axes are perpendicular to said second pair of parallel sides of said cathode, said coils functioning to generate a magnetic field having a component parallel to said evaporable surface over all of said evaporable surface, said magnetic field being represented by magnetic flux lines, said magnetic field having a component over all of said evaporable surface which is parallel to said evaporable surface and perpendicular to said second pair of parallel sides of said cathode, said magnetic field functioning to direct at least one arc discharge spot in arc evaporation or emitted secondary electrons in sputtering on said evaporable surface in a closed loop path around the periphery of said cathode, such that said material to be vaporized is vaporized from said evaporable surface.

* * * * *